United States Patent
Janik et al.

(10) Patent No.: US 7,606,677 B1
(45) Date of Patent: Oct. 20, 2009

(54) DYNAMIC MEASUREMENT CONTROL

(75) Inventors: Gary R. Janik, Palo Alto, CA (US);
Eric Bouche, Pleasanton, CA (US);
John Fielden, Los Altos, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 482 days.

(21) Appl. No.: 10/986,269

(22) Filed: Nov. 10, 2004

(51) Int. Cl.
*G06F 3/01* (2006.01)

(52) U.S. Cl. ............... 702/117; 702/120; 702/121; 702/182

(58) Field of Classification Search ............ 702/57, 702/104, 108, 117, 155, 122, 119, 120, 157, 702/186, 189; 250/492.1; 438/14, 16–18; 700/121; 709/217; 356/625; 320/114; 355/625
See application file for complete search history.

(56) References Cited

U.S. PATENT DOCUMENTS

| | | | | |
|---|---|---|---|---|
| 6,368,884 B1 * | 4/2002 | Goodwin et al. | ............. | 438/14 |
| 6,586,755 B1 * | 7/2003 | Krivokapic et al. | .... | 250/492.21 |
| 6,587,744 B1 * | 7/2003 | Stoddard et al. | ............ | 700/121 |
| 6,708,075 B2 * | 3/2004 | Sonderman et al. | ......... | 700/121 |
| 6,925,860 B1 * | 8/2005 | Poris et al. | ..................... | 73/105 |
| 6,961,636 B1 * | 11/2005 | Chong et al. | ................. | 700/121 |
| 2002/0065900 A1 * | 5/2002 | Dor et al. | ..................... | 709/217 |

* cited by examiner

*Primary Examiner*—Eliseo Ramos Feliciano
*Assistant Examiner*—Felix E Suarez
(74) *Attorney, Agent, or Firm*—Bever, Hoffman & Harms, LLP; Jeanette S. Harms

(57) ABSTRACT

A metrology recipe includes dynamic instructions that allow a metrology tool to perform a secondary metrology operation on a test wafer when previous measurement data indicates a process issue with that test wafer. The metrology recipe can instruct the metrology tool to perform an efficient default metrology operation on all test wafers, and perform a more in-depth secondary metrology operation on only those wafers that warrant additional scrutiny. In this manner, critical metrology data can be captured with a minimum of effect on metrology throughput. The metrology data used to determine whether or not the secondary metrology operation is to be performed can be generated from default metrology operations within the same tool, or can be generated by measurements taken by a completely different tool. Such "external" metrology data can be received via a communications network, either directly or from a server on the network for processing the metrology data.

22 Claims, 4 Drawing Sheets

DYNAMIC MEASUREMENT CONTROL

BACKGROUND OF THE INVENTION

1. Field of the Invention

The invention relates to the field of semiconductor metrology, and in particular, to a method and system for efficiently dealing with process issues indicated by metrology data.

2. Related Art

As the dimensions of semiconductor devices continue to shrink, accurate and efficient characterization of the components forming those devices becomes more critical. Tools used in such characterization efforts are commonly described as metrology tools. For example, ellipsometry tools, scatterometry tools, x-ray fluorescence tools, x-ray reflectometry tools, and electron microprobe analysis tools are all types of metrology tools used to evaluate the properties of the semiconductor, dielectric, and metal layers that form semiconductor devices.

A metrology tool is typically controlled by an instruction set (called a "recipe") that defines measurement parameters for that tool. Those measurement parameters can include the particular test wafers to be measured (e.g., wafers from slots 3, 7, and 12 of a wafer cassette), what type of measurement to perform (e.g., refractive index, film thickness), what type of film to expect, what locations on a wafer to measure, and any other information related to the operation of the tool.

Conventional recipes specify a static set of metrology parameters that are applied to all test wafers in a particular test group (typically one or more cassettes of wafers). Therefore, all the test wafers are measured in the same manner. The results of this testing are then reviewed by an operator to determine the appropriate response.

The goal of a metrology tool is to monitor the performance of a process tool (or set of process tools) by evaluating structures on a test wafer processed by the process tool. Specifically, the output of a metrology tool is used to detect process excursions (i.e., process results that are outside the acceptable output range), so that appropriate corrective measures can be taken.

However, because of the static nature of conventional recipes, the detection of process excursions can sometimes occur too late for optimal response. For example, if one or more of the test wafers from a cassette exhibit process excursions, it would be desirable to perform additional metrology operations on those wafers (for example, to confirm the problem, to determine the extent of the problem, or to precisely characterize the problem). Unfortunately, because of the lag between the metrology operation and the manual review of the results, the test wafers on which the process excursions have been detected have often moved on to the next process step before any additional metrology can be performed. Consequently, any opportunity to "debug" the process is lost.

Furthermore, even if the problematic wafers are caught before any further processing is performed, performing the additional metrology operations to determine the scope of the problem can result in significant (expensive) production delays. Once a problem is detected, a new static recipe must be loaded into the metrology tool and the new metrology operation must be performed. The production line is typically shut down during this reconfiguration and restarting of the process tool, thereby resulting in significantly reduced fab output even if the problem is ultimately found to be of no consequence.

Accordingly, it is desirable to provide a system and method for detecting and evaluating process excursions without significantly delaying the overall process flow.

SUMMARY OF THE INVENTION

Conventional metrology recipes specify a static set of metrology parameters, thereby forcing the same metrology operations to be applied to each test wafer in a test group. Consequently, timely detection of process excursions can be difficult, and effective analysis can be time consuming and expensive. To overcome these problems, a metrology recipe or metrology tool operation can be based on dynamic instructions that allow different metrology operations to be performed depending on prior measurement results.

In one embodiment, a metrology recipe includes an instruction for performing a default metrology operation on a test wafer and an instruction for performing a secondary metrology operation on the test wafer in response to an error indicator. The error indicator can be generated based on the results of the default metrology operation, or can be based on prior measurements taken by a different tool. This dynamic operation allows different metrology parameters to be used with different wafers. For example, a default (e.g., standard, high speed) metrology operation can be applied to most wafers, while a secondary (e.g., supplemental, in-depth) metrology operation can be applied to those wafers that exhibit indications of process excursions. Because the secondary metrology operations can be applied immediately and without reconfiguring the metrology tool (i.e., without loading a new recipe), supplemental metrology can be performed both in a timely manner and before the opportunity for such supplemental metrology is lost.

In various embodiments, the default metrology operation(s) and supplemental metrology operation(s) can include different measurement maps and measurement types. For example, in one embodiment, the supplemental metrology operation can be similar to the default metrology operation, except performed at a larger number of locations on the test wafer. In another embodiment, the supplemental metrology operation can comprise a completely different metrology type than the default metrology operation.

In another embodiment, a metrology tool can be operated such that the tool applies a default metrology operation to a test wafer, and subsequently applies a secondary metrology operation to the test wafer if the results of the default metrology operation indicate a process excursion. Thus, an efficient default metrology operation can be applied to most wafers (i.e., those not exhibiting problematic measurements), while a more in-depth secondary metrology operation can be applied to potentially problematic wafers, thereby maximizing the effectiveness of the metrology tool while minimizing the decrease in metrology throughput.

According to another embodiment, a metrology tool can be operated such that the tool applies a default metrology to a test wafer unless imported metrology data (i.e., measurement results from a different metrology tool) indicates a problem with the test wafer. In various embodiments of the invention, the imported metrology data can be provided by a networked metrology tool, and can be received either directly from the networked tool, or can be received from a central server that compiles and processes the output of the networked tool.

In another embodiment, a first metrology tool and a second metrology tool (and optional any number of additional metrology tools) are coupled via a communications network to allow the second metrology tool to perform dynamic metrology operations based on measurement data from the first metrology tool. In one embodiment, the first metrology tool and the second metrology tool communicate directly. In another embodiment, the first metrology tool and the second metrology tool are coupled to a server that processes data passed between the tools. In one embodiment, the second metrology tool can perform default metrology operations on a set of test wafers unless prior measurements on those test wafers by the first metrology tool (received as imported data by the second metrology tool) indicate a problem with one or more of the test wafers, or if the prior measurements on those test wafers indicate a problematic trend or pattern. If the imported data does indicate a process issue, the second metrology tool can apply a secondary metrology operation to the identified test wafers (or even all of the test wafers).

In another embodiment, a metrology recipe includes an instruction for measuring a default number of wafers from a test group of wafers, an instruction for performing a default metrology operation on test wafers from the test group of wafers, and an instruction for increasing the number of wafers being measured if any of the default measurements indicates a process excursion (either a wafer-specific excursion or a problematic trend). In this manner, the number of wafers tested can be increased if a problem is detected for improved process monitoring. Otherwise, the minimum number of wafers are measured to maximize metrology throughput.

The invention will be more fully understood in view of the following description and drawings.

DETAILED DESCRIPTION

Figure 1:
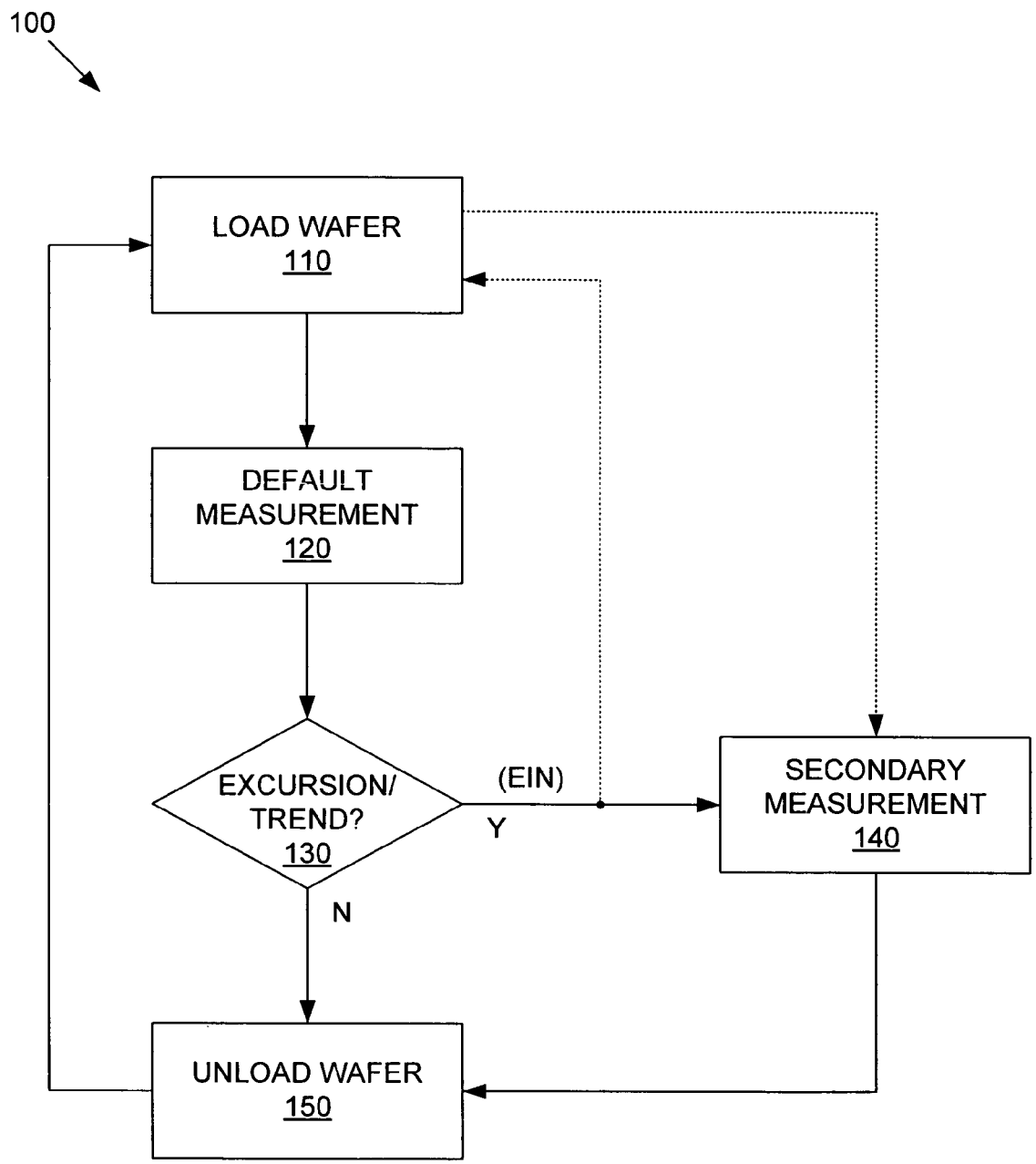
FIG. 1 is a flow diagram for a metrology recipe/tool operation process that incorporates dynamic response to prior measurements.

Conventional metrology recipes specify a static set of metrology parameters, thereby forcing the same metrology operations to be applied to each test wafer in a test group. Consequently, timely detection of process excursions can be difficult, and effective analysis can be time consuming and expensive. FIG. 1 depicts an embodiment of a metrology process flow diagram 100 that overcomes these limitations. Note that flow diagram 100 can be applied to any type of metrology operation/tool (e.g., spectroscopic ellipsometry, single wavelength ellipsometry, x-ray reflectometry, electron microprobe analysis, x-ray fluorescence, and scatterometry, among others). Note further that each step in FIG. 1 can represent an operation by a metrology tool, or an instruction (or set of instructions) in a metrology recipe.

In a "LOAD WAFER" step 110, a test wafer is loaded into the metrology tool. Then, in a "DEFAULT MEASUREMENT" step 120, a standard metrology operation is performed on the test wafer. This standard metrology operation can comprise any basic measurement designed for process monitoring. Typically, the default measurement will be a relatively quick metrology operation designed to catch major problems.

If a review of the default measurement results in a subsequent "EXCURSION/TREND?" step 130 does not turn up any process excursions, the test wafer is unloaded from the metrology tool in an "UNLOAD WAFER" step 150, and the process loops back to step 110 for the next test wafer. However, if a process excursion is detected in step 130, an error indicator EIN causes a secondary measurement to be performed on the test wafer in a "SECONDARY MEASUREMENT" step 140. The secondary measurement is a metrology operation that is designed to provide enhanced information about process excursion results detected in step 130.

Note that in one embodiment, the default measurement performed in step 120 can be repeated in step 140 to confirm the process excursion noted in step 130. However, the secondary measurement performed in step 140 will typically be a more detailed or more sensitive metrology operation that provides additional information about the process excursion detected in step 130.

For example, in one embodiment, the default measurement in step 120 can take measurements at a first number of measurement locations, while the secondary measurement in step 140 can take measurements at a larger number of measurement locations. Exemplary measurement maps for the default and secondary measurements are shown in FIGS. 2A and 2B, respectively.

Figure 2A:
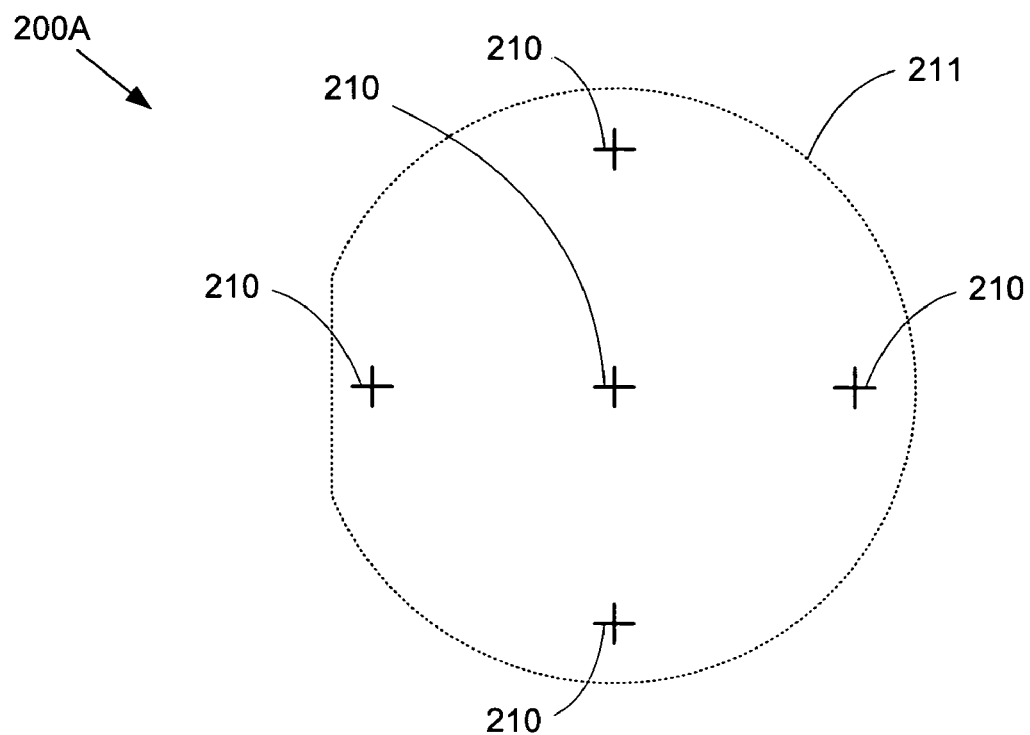
FIGS. 2A and 2B are exemplary measurement maps for default and secondary (supplemental) measurement operations, respectively, in a dynamic metrology process.

FIG. 2A shows a sample default measurement map 200A that can be used in step 120 of FIG. 1. Measurement map 200A specifies five measurement locations 210 for each test wafer 211 (shown as a dotted line for reference). The relatively small number of default measurement locations 210 allows the default measurement operation of step 120 to be relatively fast, thereby maximizing metrology throughput.

Figure 2B:
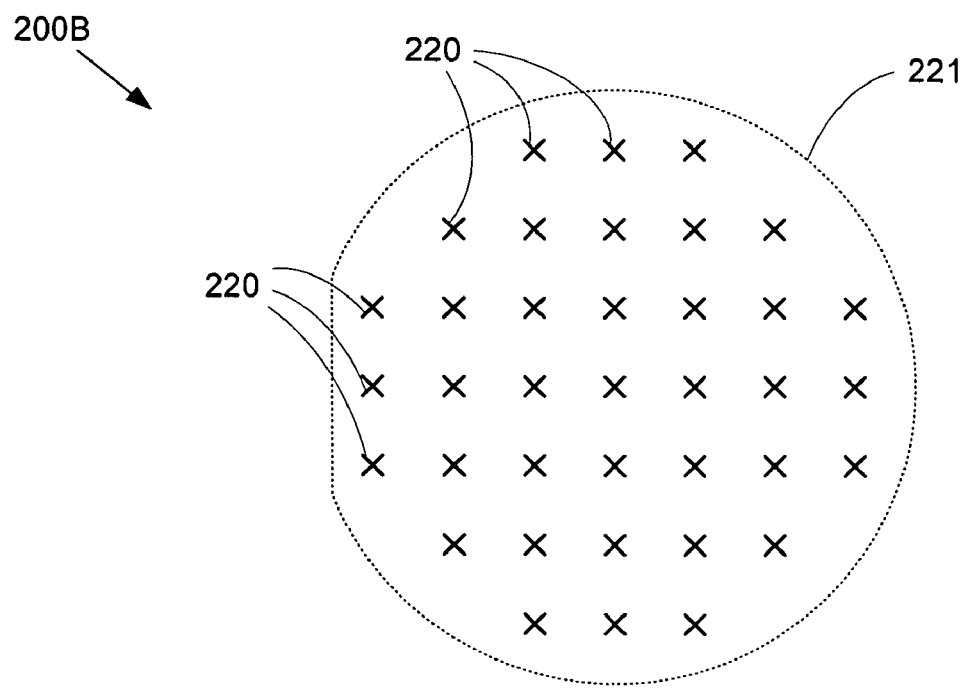

In contrast, FIG. 2B shows a sample secondary measurement map 200B that can be used in step 140 of FIG. 1. Measurement map 200B specifies thirty-seven measurement locations 220 for a test wafer 221 (shown as a dotted line for reference). The larger number of secondary measurement locations 220 allows the secondary measurement operation of step 140 to provide a detailed and accurate indication of the process quality. Note that in one embodiment, secondary measurement locations 220 can include default measurement locations 210, thereby enabling direct comparison between the results of the default and secondary measurement operations.

Returning to FIG. 1, once the secondary measurement of step 140 is completed, the test wafer is removed from the metrology tool (e.g., placed back in to the wafer cassette) in step 150, and the process loops back to step 110, where the next test wafer is loaded into the metrology tool. This looping continues until all the test wafers in the test group (e.g., a single wafer cassette) have been measured. Note that in one embodiment, the number of test wafers from a test group to be measured can be increased based on error indicator EIN (e.g., while only three wafers from a cassette may be measured during normal testing, if a problematic trend is detected in step 130, the number of wafers to be tested may be increased to 6).

Note that "SECONDARY MEASUREMENT" step 140 (and even "DEFAULT MEASUREMENT" step 120) can include any number of different measurement operations, and can also include any number of different types of metrology operations. For example, the metrology tool being used could include multiple measurement technique capabilities, such as a combination x-ray reflectometry (XRR) and x-ray fluorescence (XRF) tool, as described in co-owned, co-pending U.S. patent application Ser. No. 10/094,537. The default measurement performed in step 120 could comprise an initial XRR measurement at the default measurement locations to make an initial assessment of film thickness. Then, if any excessively thick or thin measurements are detected in step 130, additional XRR and XRF measurements could be taken in step 140. The supplemental XRR measurements could then be used to evaluate overall film thickness, while the additional XRF measurements could be used to determine if the process excursion is due to a reaction chemistry issue.

Note further that in another embodiment, application of "SECONDARY MEASUREMENT" step 140 can be applied based on trend analysis of previous metrology results. For example, if the data from "DEFAULT MEASUREMENT" step 120 for a series of wafers in a test group indicate a problematic trend when analyzed in step 130, an error indicator EIN may be issued that instructs that the next test wafer receiver receive the more rigorous testing in step 140. In one embodiment, a test wafer so identified by error indicator EIN can bypass step 120 completely, as indicated by the dotted arrows. In this manner, application of "SECONDARY MEASUREMENT" step 140 can be triggered by prior metrology results, rather than data from the current wafer.

Figure 3A:
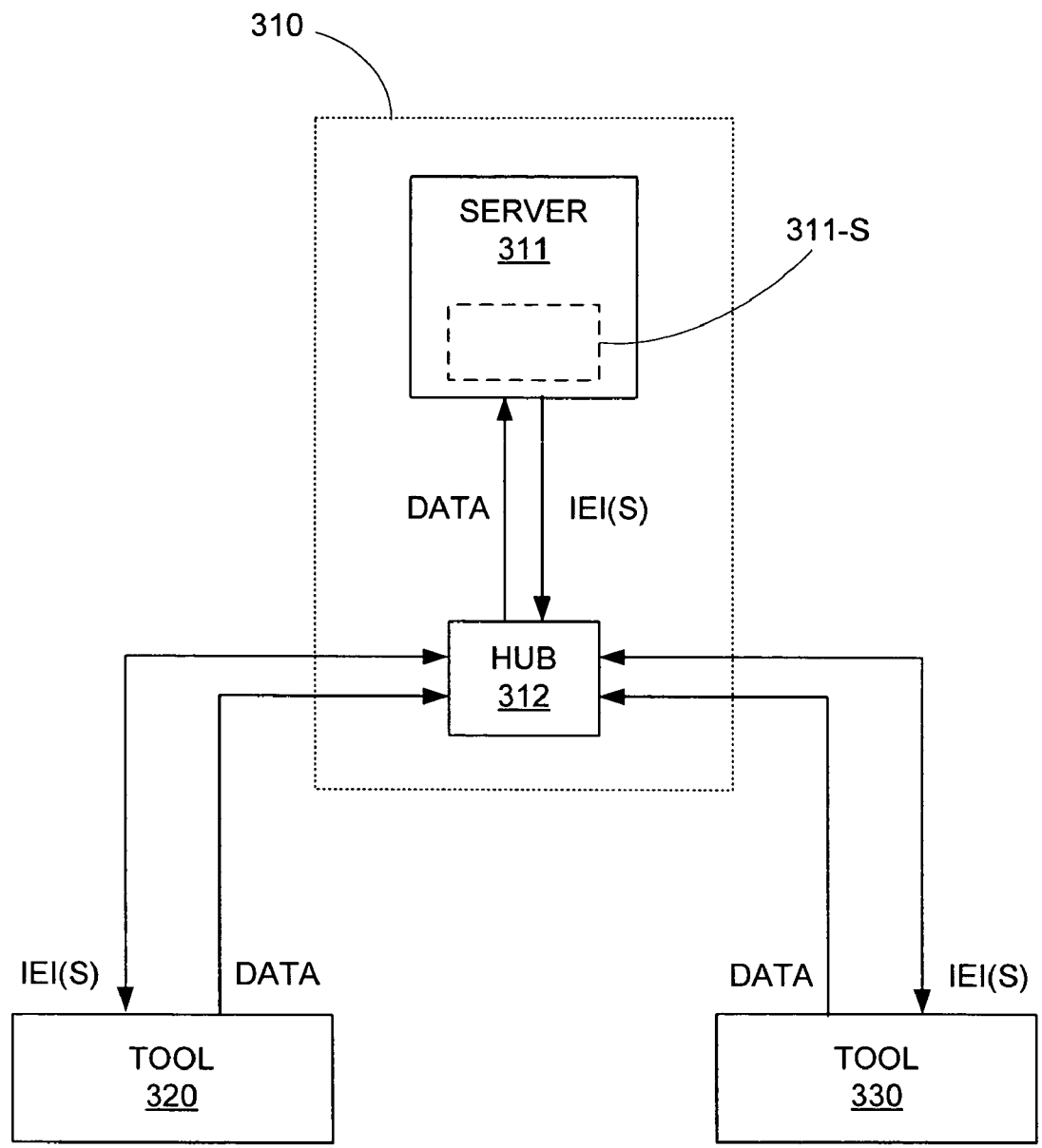
FIG. 3A is a block diagram of a grouping of metrology tools incorporating communications capabilities to enable dynamic metrology operations.

Note further that in various other embodiments, a dynamic recipe can instruct a metrology tool to perform supplemental/more exacting measurement operations on test wafers based on imported metrology results; i.e., measurements not made using the current metrology tool. For example, FIG. 3A shows a pair of metrology tools 320 and 330 that are connected via a communications network 310. Communications network 310 can comprise any type of communications path, including, for example, a server 311 and a hub 312 for managing network traffic between metrology tools 320 and 330 and server 311. Optionally, metrology data DATA from tools 320 and 330 can be compiled and processed by error-detection software 311-S in server 311, with software 311-S generating initial error indicators IEI(S) upon detecting process excursions or problematic trends/patterns. Server 311 can then send error indicators IEI (S) to either of tools 320 and 330 for use with the dynamic recipes controlling those tools. Alternatively, either or both of metrology tools 320 and 330 could generate error indicators IEI (S) based on their own metrology results.

In one embodiment, each of metrology tools 320 and 330 can operate according to the flow diagram shown in FIG. 1 for any given test group of wafers. However, in another embodiment, the operation of metrology tool 330 can be based in part on prior measurements (of the same wafers) by metrology tool 320. For example, assume a metrology flow in which metrology tool 320 performs a first measurement operation on a test group of wafers, after which metrology tool 330 performs a second measurement operation on the same test group of wafers. During or after the operation of metrology tool 320 on the test group of wafers, error detection software 311-S in server 311 compiles the resulting metrology data DATA and identifies any potential problems (e.g., process excursions, increasing error trends, or unusual process variations). Server 311 then issues an appropriate error indicator IEI(S) to metrology tool 330, which applies the appropriate supplemental metrology to the identified test wafers. In one embodiment, in response to metrology data taken from metrology tool 320, metrology tool 330 might test more wafers or apply more rigorous testing/testing of a different type. In another embodiment, metrology tool 330 might only perform metrology operations on the test group of wafers if the data from metrology tool 320 indicates an excursion or problematic trend.

In another embodiment, the operation of metrology tool 330 can be based in part on prior measurements of a different set of test wafers. For example, assume a metrology flow in which metrology tool 320 performs a first measurement operation on a first test group of wafers, after which metrology tool 330 performs a second measurement on a second test group of wafers. If the first test group and the second test group are related (e.g., two cassettes processed by the same tool), server 311 could issue an appropriate error indicator IEI(S) to metrology tool 330 to instruct metrology tool 330 to apply an appropriate metrology operation to the second test group based on the data from the first test group.

Note that while only two metrology tools (320 and 330) are shown for exemplary purposes, any number of metrology tools can be networked to enable dynamic metrology operations based on shared measurement data. Note further that initial error identifier signal IEI(S) can either identify specific test wafers (e.g., identifying specific wafers exhibiting process excursions), or can indicate that the entire test group requires additional measurement testing (e.g., identifying process results trending in a problematic direction).

Figure 3B:
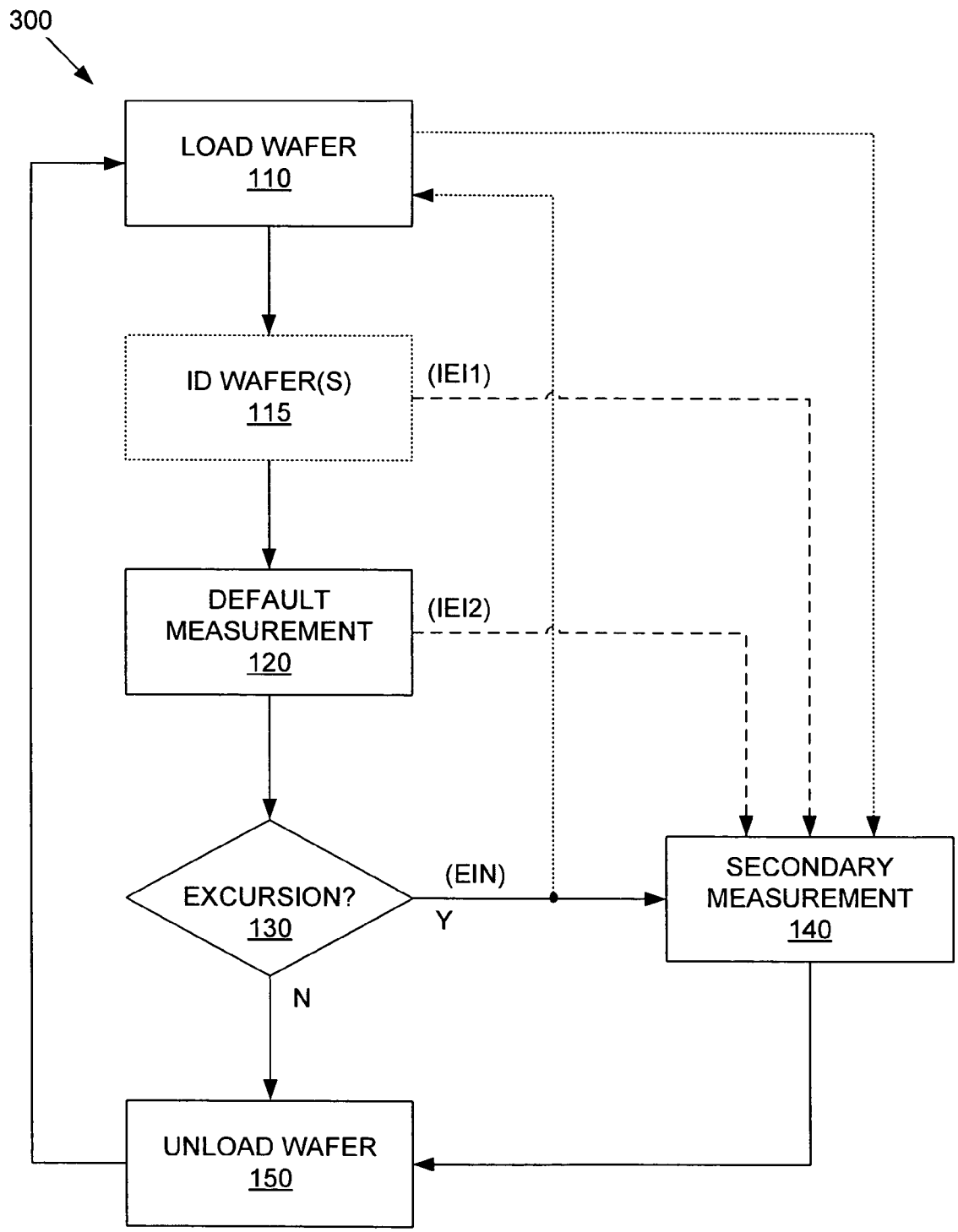
FIG. 3B is a flow diagram for a metrology recipe/tool operation process that incorporates dynamic response to imported measurements.

FIG. 3B shows a flow diagram 300 of a dynamic metrology recipe (or metrology tool operation flow in response to the dynamic metrology recipe) that includes input from prior metrology operations. Flow diagram 300 is substantially similar to flow diagram 100 shown in FIG. 1, except that flow diagram 300 includes an additional "ID WAFER(S)" step 115. In step 115, information related to prior metrology operations (e.g., error indicators IEI(S) in FIG. 3A) is evaluated with respect to the current test group. If the prior metrology information indicates process excursions (or potential process excursions), the metrology operation can bypass "DEFAULT MEASUREMENT" step 120 and progresses directly to "SECONDARY MEASUREMENT" step 140 (indicated by error indicator IEI1), where an appropriate metrology operation(s) is performed in light of the indicated process excursions. In another embodiment, if the prior metrology information indicates process excursions (or potential process excursions), the metrology operation can perform the "DEFAULT MEASUREMENT" step 120 and then move on to the "SECONDARY MEASUREMENT" step 140 (indicated by error indicator IEI2). In this manner, potential process problems can be quickly identified and evaluated.

Although the invention has been described in connection with several embodiments, it is understood that the invention is not limited to the embodiments disclosed, but is capable of various modifications that would be apparent to one of ordinary skill in the art. Thus, the invention is limited only by the following claims and their equivalents.

The invention claimed is:

1. A metrology recipe comprising:
   an instruction for performing a default metrology operation on a test wafer; and
   an instruction for automatically performing a secondary metrology operation on the test wafer in response to an error indicator generated by performing the default metrology operation, the secondary metrology operation for at least one of confirming a process excursion, determining an extent of the process excursion, and characterizing the process excursion;
   an instruction for not performing the secondary metrology operation on the test wafer when the error indicator is not present,
   wherein the instruction for performing the default metrology operation, the instruction for automatically performing the second metrology operation, and the instruction for not performing the secondary metrology operation are provided on a computer-readable medium.

2. The metrology recipe of claim 1, further comprising an instruction for generating the error indicator using imported metrology results.

3. The metrology recipe of claim 2, further comprising an instruction for bypassing the default metrology operation in response to the error indicator.

4. The metrology recipe of claim 2, further comprising an instruction for performing the default metrology operation before performing the secondary metrology operation.

5. The metrology recipe of claim 1, further comprising an instruction for generating the error indicator using prior metrology results.

6. The metrology recipe of claim 5, wherein the prior metrology results comprise a series of measurement data from a plurality of previous test wafers, each of the series of measurement data being generated by the default measurement operation.

7. The metrology recipe of claim 1, wherein performing the default metrology operation comprises performing a first metrology operation at each of a first plurality of test locations on the test wafer, and
wherein performing the secondary metrology operation comprises performing a second metrology operation at each of a second plurality of test locations on the test wafer, wherein the second plurality is greater than the first plurality.

8. The metrology recipe of claim 7, wherein the second plurality of test locations includes the first plurality of test locations.

9. The metrology recipe of claim 1, wherein the default metrology operation comprises a first metrology type, and
wherein the secondary metrology operation comprises a second metrology type, the first metrology type being different from the second metrology type.

10. A method for operating a metrology tool, the method comprising:
applying a default metrology operation to a test wafer;
automatically applying a secondary metrology operation to the test wafer when any metrology data from the default metrology operation indicates a process excursion, the secondary metrology operation for at least one of confirming the process excursion, determining an extent of the process excursion, and characterizing the process excursion; and
not performing the secondary metrology operation on the test wafer when the process excursion is not present.

11. The method of claim 10, wherein applying the default metrology operation comprises performing a first metrology operation at a first plurality of test locations on the test wafer, and
wherein applying the secondary metrology operation comprises performing a second metrology operation at a second plurality of test locations on the test wafer, the second plurality being greater than the first plurality.

12. The method of claim 11, wherein the second plurality of test locations includes the first plurality of test locations.

13. The method of claim 10, wherein the default metrology operation comprises a first metrology type, and wherein the secondary metrology operation comprises a second metrology type, the second metrology type being different from the first metrology type.

14. A method for operating a metrology tool, the method comprising:
importing a set of metrology results for a test wafer;
applying only a default metrology operation to the test wafer when the set of metrology results does not indicate an error condition for the test wafer;
applying a secondary metrology operation to the test wafer when the set of metrology results indicates the error condition for the test wafer, the secondary metrology operation for at least one of confirming the error condition, determining an extent of the error condition, and characterizing the error condition; and
not performing the secondary metrology operation on the test wafer when the error condition is not present.

15. The method of claim 14, further comprising applying the default metrology operation to the test wafer prior to applying the secondary metrology operation to the test wafer if the set of metrology results indicates the error condition for the test wafer.

16. The method of claim 14, wherein applying the default metrology operation comprises performing a first metrology operation at a first plurality of test locations on the test wafer, and
wherein applying the secondary metrology operation comprises performing a second metrology operation at a second plurality of test locations on the test wafer, the second plurality being greater than the first plurality.

17. The method of claim 14, wherein the default metrology operation comprises a first metrology type, and wherein the secondary metrology operation comprises a second metrology type, the second metrology type being different from the first metrology type.

18. A system for measuring wafer properties, the system comprising:
a first metrology tool for applying a first metrology operation to a first set of test wafers to generate a first set of metrology data;
a communications network; and
a second metrology tool coupled to the first metrology tool via the communications network,
the second metrology tool being configured to apply a default metrology operation to the first set of test wafers when the first set of metrology data does not indicate an error condition for the first set of test wafers,
the second metrology tool being further configured to apply a secondary metrology operation to one or more of the first set of test wafers when the first set of metrology data indicates the error condition for the first set of test wafers, the secondary metrology operation for at least one of confirming the error condition, determining an extent of the error condition, and characterizing the error condition.

19. The system of claim 18, wherein the communications network comprises a server coupled to the first metrology tool and the second metrology tool, the server comprising:
logic for generating an error indicator signal when the first set of metrology data includes a process excursion for at least one of the first set of test wafers; and
logic for transmitting the error indicator signal to the second metrology tool, the second metrology tool applying the secondary metrology operation to the at least one of the first set of test wafers in response to the error indicator signal.

20. The system of claim 18, wherein the communications network comprises a server coupled to the first metrology tool and the second metrology tool, the server comprising:
logic for generating an error indicator signal when the first set of metrology data exhibits process results trending in a problematic direction; and
logic for transmitting the error indicator signal to the second metrology tool, the second metrology tool applying the secondary metrology operation to the first set of test wafers in response to the error indicator signal.

21. A computer system for communicating with a first metrology tool and a second metrology tool, the computer system comprising:
- means for receiving metrology data associated with a set of test wafers from the first metrology tool;
- means for generating an error indicator signal only when the metrology data associated with the set of test wafers deviates from expected results; and
- means for providing the error indicator signal to the second metrology tool for use in performing a metrology operation on the set of test wafers, the metrology operation for at least one of confirming deviation from expected results, determining an extent of the deviation, and characterizing the deviation.

22. A metrology recipe comprising:
- an instruction for measuring a default number of wafers from a test group of wafers;
- an instruction for performing a default metrology operation on a test wafer from the test group of wafers to generate a set of metrology data; and
- an instruction for automatically increasing the default number when the set of metrology data indicates a process excursion,
- wherein the instructions for measuring, performing, and increasing are provided on a computer-readable medium.

* * * * *

UNITED STATES PATENT AND TRADEMARK OFFICE
CERTIFICATE OF CORRECTION

PATENT NO. : 7,606,677 B1  Page 1 of 1
APPLICATION NO. : 10/986269
DATED : October 20, 2009
INVENTOR(S) : Janik et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 522 days.

Signed and Sealed this

Twelfth Day of October, 2010

David J. Kappos
*Director of the United States Patent and Trademark Office*